(12) United States Patent
Ohmori

(10) Patent No.: US 6,300,559 B1
(45) Date of Patent: Oct. 9, 2001

(54) DYE-SENSITIZATION-TYPE PHOTOELECTRIC CONVERSION ELEMENT

(75) Inventor: Masahiro Ohmori, Chiba (JP)

(73) Assignee: Showa Denko Kabushiki Kaisha, Tokyo (JP)

(*) Notice: Subject to any disclaimer, the term of this patent is extended or adjusted under 35 U.S.C. 154(b) by 0 days.

(21) Appl. No.: 09/534,561

(22) Filed: Mar. 27, 2000

Related U.S. Application Data
(60) Provisional application No. 60/162,158, filed on Oct. 29, 1999.

(30) Foreign Application Priority Data
Mar. 25, 1999 (JP) ................................................ 11-081259

(51) Int. Cl.⁷ ............................................... H01L 31/0256
(52) U.S. Cl. ...................... 136/263; 136/252; 136/256; 429/111; 257/43; 257/40; 438/104; 438/85; 438/82; 438/99
(58) Field of Search .................... 136/263, 252, 136/256; 429/111; 257/43, 40; 438/104, 85, 82, 99

(56) References Cited

U.S. PATENT DOCUMENTS
5,885,368 * 3/1999 Lupo et al. .......................... 136/263

FOREIGN PATENT DOCUMENTS
826633 * 3/1998 (EP).

* cited by examiner

*Primary Examiner*—Alan Diamond
(74) *Attorney, Agent, or Firm*—Sughrue, Mion, Zinn, Macpeak & Seas, PLLC

(57) ABSTRACT

A dye-sensitization-type photoelectric conversion element comprising a semiconductor and a dye adhering onto a surface of the semiconductor, which semiconductor is predominantly comprised of brookite-type titanium oxide. The dye-sensitimation-type photoelectric conversion element is preferably made of a titanium oxide sol predominantly comprising brookite-type titanium oxide, produced by a process comprising a step of hydrolyzing titanium tetrachloride or titanium trichloride.

9 Claims, 1 Drawing Sheet

DYE-SENSITIZATION-TYPE PHOTOELECTRIC CONVERSION ELEMENT

This application claims benefit under 35 U.S.C. Å 119 (e) of U.S. patent application Ser. No. 60/162,158 filed Oct. 29, 1999.

BACKGROUND OF THE INVENTION

(1) Field of the Invention

This invention relates to a dyo-sensitization-type photoelectric conversion element, which is used for a solar cell and other photoelectric conversion elements, an optical sensor, and a photo-revolving element.

(2) Description of the Related Art

Solar cells such as a silicon solar cell, a gallium arsenide (GaAs) solar cell, and an indlum phosphide (InP) solar cell have so far been put into practice. However, these cells are disadvantageously high-cost products.

A solar cell comprising an oxide semiconductor such as titanium dioxide ($TiO_2$) is already known. However, titanium oxide exhibits poor photoelectric conversion since it absorbs exclusively light having a short wavelength. Thus, a dye-sensitization-type photoelectric conversion element has been proposed to improve photoelectric conversion.

A typical dye-sensitizatlon-type photoelectric conversion element has a laminate structure, illustrated in FIG. 1, which comprises a thin film 3 formed of titanium oxide particles, a transparent electrode 2 disposed on one side of the film 1, and a dye 4, an electrolyte 5, and an electrode 6 which are disposed in this order on the other side of the film 1. The dye absorbs sunlight to thereby generate electrons ($e^-$) and holes ($h^+$). The thus-released electrons ($e^-$) are injected into the thin titanium oxide film 3, while the holes ($h^+$) react With the electrolyte 5. When the employed electrolyte 5 includes, for example, iodide ions ($I^-$) which react with the holes ($h^+$) to thereby form $I_3^-$ ions.

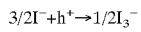

On the electrode 6 disposed in the side of electrolyte 5, electrons ($e^-$) react with $I_3^-$ contained in the electrolyte, to thereby form $I^-$. Thus, a circuit is formed to thereby generate an electromotive force.

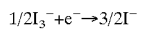

As specific examples of semiconductors which are used in such a photoelectric conversion element, there can be mentioned titanium oxide, zinc oxide, and zinc sulfide. Of these, titanium oxide is most popularly used. As specific examples of the dye, there can be mentioned ruthenium complexes and porphyrin derivatives.

Titanium oxide (titanium dioxide) includes three known crystal structures, i.e., anatase, brookite, and rutile. When titanium oxide is produced by a vapor phase method wherein titanium tetrachloride is subjected to premixed combustion by incorporation with oxygen or oxygen-containing gas, an anatase crystal structure is formed at a low temperature and remains stable. When the anatase crystal structure is heated for firing, a brookite crystal structure is formed at a temperature of 816 to 1.040° C, and a rutile crystal structure is formed at a temperature higher than 1,040° C. (*Rikagaku jiten*, 3rd edition, p. 514–515).

Although titanium oxide is most popularly used as a semiconductor employed for a dye-sensitization-type photoelectric conversion element, almost no investigation has been conducted on the influence of the particular types of crystal structure. Typically, rutile-type titanium oxide or anatase-type titanium oxide is employed, as described in Japanese Unexamined Patent Publication (kokai) No. H10-255863.

SUMMARY OF THE INVENTION

A primary object of the present invention is to provide a dye-sensitization-type photoelectric conversion element comprising titanium oxide as a semiconductor, which exhibits an enhanced photoelectric conversion.

The present inventor has studied photoelectric effect of a dye-sensitization-type photoelectric conversion element comprising titanium oxide as a semiconductor, and found that, when electron and holes are generated in a dye upon absorption of light, the excited electrons are deactivated within a very short time, i.e., $10^{-5}$ to $10^{-12}$ seac, and further found that it is important to inject the excited electrons into titanium oxide at a very high rate, more specifically, at a rate more than 100 times of the rate of deactivation to attain a high photoelectric conversion efficiency. The present inventor further studied the relationship between the crystal structure of titanium oxide and photoelectric conversion efficiency of photoelectric conversion elements, and have found that when brookite-type titanium oxide, which has not been paid any attention so far, is employed, excellent photoelectric conversion efficiency is attained as compared with a photoelectric conversion element comprising rutile- or anatase-type titanium oxide. The present invention has been accomplished on the basis of this finding.

In accordance with the present invention, there is provided a dye-sensitization-type photoelectric conversion element comprising a semiconductor and a dye adhering onto a surface of the semiconductor, which semiconductor is predominantly comprised of brookite-type titanium oxide.

Preferably, the semiconductor comprises at least about 70% by weight, based on the weight of the semiconductor, of brookite-type titanium oxide.

In accordance with the present invention, there is further provided a process for producing the above-mentioned dye-sensitization-type photoelectric conversion element, which comprises a step of immersing a substrate having a titanium oxide surface layer predominantly comprised of brookite-type titanium oxide in a solution containing a dye to allow the dye to adhere onto the titanium oxide surface layer.

DETAILED DESCRIPTION OF THE PREFERRED EMBODIMENTS

Figure 1:
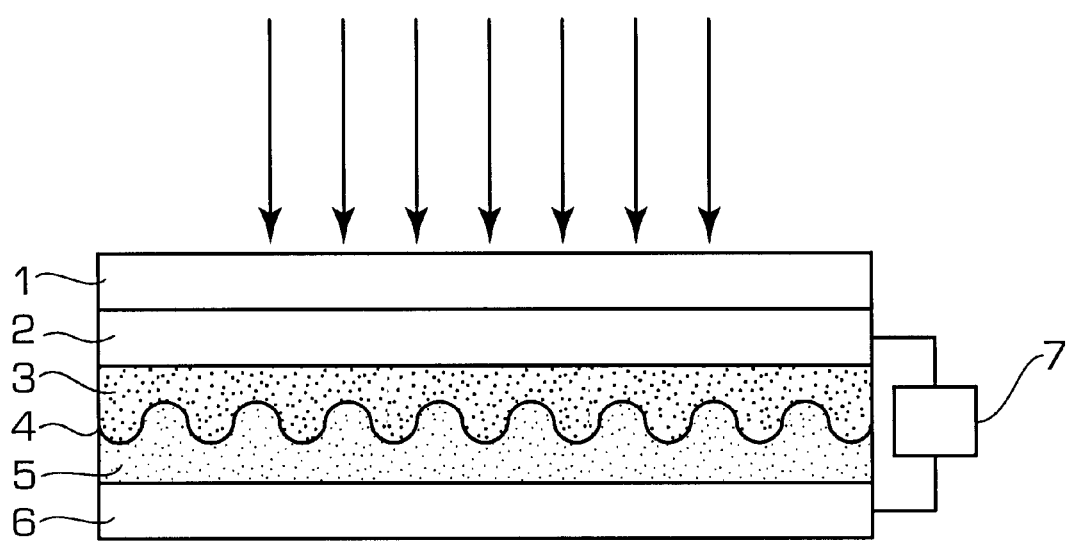
FIG. 1 is a cross-sectional view showing a preferred embodiment of the dye-sensltizatlon-type photoelectric conversion element of the present invention.

The present invention will be described in detail with reference to the accompanying drawing.

In FIG. 1 showing an example of a solar cell made of the dye-sensitization-type photoelectric conversion element of the present invention, the lower surface of a glass substrate 1 is coated with a transparent conductive film 2. The transparent conductive film 2 is composed of, for example, fluorine-doped tin oxide. On the underside of the transparent conductive film 2 in disposed a thin layer 3 comprising as semiconductor titanium oxide particles. The titanium oxide thin layer 3 is formed by a coating method such as bar-coating, dip-coating, flow-coating or roll-coating, followed by heating at a temperature of approximately 300 to approximately 600° C. The titanium oxide thin layer 3 usually has a thickness of about 0.1 μm to about 50 μm, preferably about 1 μm to about 30 μm.

The titanium oxide thin layer 3 of the dye-sensitization-type photoelectric conversion element of the present invention is predominantly comprised of brookite-type titanium oxide, namely, the titanium oxide thin layer 3 is composed of titanium oxide particles comprising larger than about 50% by weight, preferably at least about 70% by weight, based on the weight of the titanium oxide particles, of brookite-type titanium oxide. More specifically, the titanium oxide constituting the thin layer 3 is comprised of 100% by weight of brookite-type titanium oxide; or comprised of a mixed crystal of anatase-type titanium oxide/brookite-type titanium oxide, which contains smaller than about 50% by weight of anatase-type titanium oxide; a mixed crystal of rutile-type titanium oxide/brooklte-type titanium oxide, which contains smaller than about 50% by weight of rutile-type titanium oxide; or a mixed crystal of anatase-type titanium oxide/rutile-type titanium oxide/brookite-type titanium oxide, which contains smaller than about 50% by weight of the sum of anatase-type titanium oxide and rutile-type titanium oxide.

Titanium oxide particles of the thin layer 3 preferably have an average particle diameter of not larger than about 0.1 μm, more preferably in the range of about 0.01 μm to about 0.05 μm, and most preferably about 0.01 μm to about 0.03 μm.

The brookite-type titanium oxide used in the present invention includes that, which has been prepared by heat-treating anatase-type titanium oxide, and that, which has been synthesized by a wet synthetic process. Of these, that which has been synthesized by a wet synthetic process is preferable. Especially, that which has been synthesized by a process comprising a step of hydrolyzing titanium tetrachloride or titanium trichlorlde to most preferable. This is because the brookite-type titanium oxide prepared by a wet synthetic process is obtained in a sol form, and the sol is readily used for forming a transparent coating giving a titanium oxide thin layer which can be easily sensitized by excited electrons injected from the dye.

A dye 4 is caused to adhere onto the underside of the titanium oxide thin layer 3. The dye used is not particularly limited provided that it exhibits absorption spectrum at wavelength region of visible light, and it is capable of exciting electrons upon irradiation with light. The dyes used include, for example, 9-phenylxanthene-type, coumarin-type, acridine-type, tetraphenylmethane-type, guinone-type, aro-type and indigo-type dyes. As specific examples of the dyes, there can be mentioned Eosine-Y, Rhodamine-B, Rhodamine-6G, perylene, anthocyanin, ruthenium complexes and porphyrin derivatives. Of these, ruthenium complexes and porphyrin derivatives are preferable. Ruthenium complexes are more preferable, which include, for example, ruthenium bipyrldine dyes such as $RuL_2(SCN)_2$ (L=2,2'-bipyridyl-4,4'-dicarboxylate), and ruthenium phenanthroline dyes such as $RuL_2(SCN)$, (L=1,10'-phenanthroline-4,7'-dicarboxylate).

Adherence of dye 4 onto the underside of the titanium oxide thin layer 3 can be carried out as follows. For example, the titanium oxide thin layer 3 is immersed in a solution containing a dye. Solvents used for dissolving a dye therein include, for example, methanol and ethanol. Alternatively, in a manner as disclosed in Japanese Unexamined Patent Publication (kokai) No. H10-255863, the dye may be caused to adhere on the surface of titanium oxide particles, and a thin layer 3 may be formed from the dye-adhered titanium oxide particles. In this embodiment, formation of dye-adhering layer 4 may be omitted.

An electrolyte 5 and an electrode 6 such as platinum are successively disposed in this order on the underside of the dye 4, to thereby form a cell. As specific examples of the electrolyte 5, there can be mentioned a solution of tetrapropylammonium iodide in acetonitrile and a solution of lithium iodide in acetonitrile. Although the electrode 6 illustrated in FIG. 1 is made of platinum, the platinum electrode may be replaced by transparent conductive film-coated glass. When the platinum electrode is used, light irradiation is carried out through the upper glass substrate 1. When the transparent film-coated glass is used, light irradiation may also be carried out through the transparent film-coated glass.

As described above, a dye is irradiated with light to generate electrons ($e^-$) and holes ($h^+$). Electrons are transferred to an electrode (negative electrode) through the titanium oxide thin layer, while holes oxidize the electrolyte and are reduced by electrons supplied from the negative electrode. Thus, a redox cell is formed, and electricity can be obtained in the form of electric load 7.

The reason why excellent photoelectric conversion efficiency is realized when brookite-type titanium oxide is used as semiconductor in the photoelectric conversion element of the present invention as compared with a photoelectric conversion element employing rutile- or anatase-type titanium oxide has not been elucidated. However, it is presumed that the photoelectric conversion efficiency varies depending upon state of bonding between dye and titanium oxide, electron mobility, position of Ti—O bonds, band gap, and hydroxyl groups found on the surface of titanium oxide particles. Especially, rutile-type and anatase-type crystalline structures are tetragonal and highly symmetric, and, in an atomic configuration of one titanium atom with six contiguous oxygen atoms, there exist only two different titanium-oxygen bond distances. In contrast, a brookite-type crystalline structure is rhombic and asymmetric, and, in an atomic configuration of one titanium atom with six contiguous oxygen atoms, there exist six different titanium-oxygen bond distances. Due to this difference of atomic configuration, there to a difference in a bonded state of titanium oxide to a dye between a brookite-type crystalline structure and rutile-type or anatase-type crystalline structure. Therefore, a sallent amount of electrons are injected into a brookite-type titanium oxide as compared with rutile-type or anatase-type titanium oxide.

By way of examples and comparative examples, the present invention now will be specifically described in more detail.

In the working examples, the type of crystalline structure of titanium oxide was identified and the proportion of titanium oxide having the thus-identified crystal structure was measured by the following methods.

(1) Identification and content of each titanium oxide crystalline structure

As shown in Table 1, which has been extracted from JCPDS cards, X-ray diffraction peaks of brookite-type, anatase-type and rutile-type titanium oxides overlap one another Particularly, the main peak (of relative intensity= 100) of brooklte-type and that of anatase-type as represented by d values are 3.51 (crystal face 120) and 3.52 (crystal face 101), respectively. These values correspond to approximately 28.1° as reduced to 2θ values of the Cu tube employed in X-ray diffraction. Since the difference in angle is 0.10 or less as expressed by the 2θ value, the amount of each type of titanium oxide crystalline structure cannot be determined from the relative intensity of the respective overlapped main peak. Moreover, brookite-type titanium oxide has a peak at a d value of 3.47 (crystal face 111). These three peaks having 2θ values of approximately 28.1° to 28.5 substantially overlap one another.

As mentioned above, the main peak intensity of brooklte-type titanium oxide and that of anatase-type titanium oxide cannot be determined individually. Thus, the peak attributed to the 121 face of brookite-type titanium oxide, which peak does not overlap with peaks attributed to anatase-type titanium oxide, was employed. More specifically, the ratio of the peak intensity attributed to the 121 face of brooklte-type titanium oxide to the peak intensity at a position where the three peaks overlap, i.e. (the intensity of the peak attributed to the 121 face of brookite-type)/(the peak intensity at the overlapped position), was obtained, to thereby determine the amounts of brooklte-type titanium oxide and anatase-type titanium oxide individually. The amount of rutlle-type titanium oxide was determined from the ratio of the main peak intensity attributed to the 110 face of rutile-type titanium oxide to the aforementioned peak intensity at a position where the three peaks overlap, i.e., the intensity of the main peak attributed to rutile-type)/(the peak intensity at the overlapped position).

Measurement was carried out by means of an X-ray diffractometer (RAD-B Rotor-flex, supplied by Rigaku Denki K.K.). Identification of X-ray diffraction peaks and quantitative analyzing bageg on Gata progggeing were carried out simultaneously.

(2) Short-circuit current and open-circuit current

The electromotive force of a solar call was evaluated through irradiation of a photoelectric conversion element from a glass substrate surface with light from a 160-W high-pressure mercury lamps and measurement of short-circuit current and open-circuit current during irradiation.

Preparation of titanium oxide (1) Preparation of brookite-type titanium oxide (Example 1), anatase-type titanium oxide (Comparative Example 1) and rutile-type titanium oxide (Comparative Example 2) by heat-treatment Example 1, Comparative Examples 1 and 2

Commercially available anatase-type titanium oxide (ST-01, supplied by Ishihara Sangyo Kaisha, Ltd.) was transformed into brookite-type titanium oxide by heating at approximately 900° C. Further heating at approximately 1,200° C. caused transformation into rutile-type titanium oxide. The three types of titanium oxide were crushed by means of a pneumatic-impact-type crusher, and classified by means of a pneumatic classifier, to thereby obtain particles having an average particle diameter of approximately 0.1 μm. The content of each crystal structure type was determined by the aforementioned X-ray diffraction analysis, and the results are shown in Table 2. In table 2, titanium oxide in Example 1 includes brookite-type, that in Comparative Example 1 includes anatase-type, and that in Comparative Example 2 includes rutile-type.

(2) Synthesis of brookite-type titanium oxide by a wet process:

Example 2

Distilled water (954 ml) was placed in a reaction vessel equipped with a reflux condenser and was heated to 95° C. An aqueous solution (46 ml) of titanium tetrachloride (Ti contents 16.3% by weight, specific gravity: 1.59, purity: 99.9%) was added dropwise to the distilled water at a rate of approximately 5.0 ml/min with constant stirring at a stirring rate of approximately 200 rpm. During addition, the temperature of the reaction mixture was carefully controlled so as not to lower. Thus, the concentration of titanium tetrachloride was 0.25 mol/l (2% by weight as reduced to titanium).

Just after the commencement of addition, the reaction mixture in the reaction vessel became turbid. The reaction mixture was maintained at the temperature regardless of the turbidity. After completion of addition, the reaction mixture was further heated to the vicinity of the boiling temperature (104° C.), and maintained at that temperature for 60 minutes, to thereby complete reaction.

The sol thus-obtained through the reaction was filtered and dried by a vacuum dryer at 60° C. to obtain a powder. Quantitative analysis of the powder by the aforementioned X-ray diffraction analysis revealed that the ratio (the intensity of the peak attributed to the 121 face of brooklte-type)/(the peak intensity at the overlapped position) was 0.38, and the ratio (the intensity of the main peak attributed to rutile-type)/(the peak intensity at the overlapped position) was 0.05. By calculation from these ratios, the thus-obtained crystalline titanium oxide was proven to have a brookite content of approximately 70.0% by weight, a rutile content of approximately 1.24 by weight, and an anatase content of approximately 28.8% by weight. The obtained fine particles were observed by a transmission electron microscope, to determine the particle size. The particles had an average primary particle diameter of 0.015 μm.

Example 3

An aqueous titanium trlchlorlde solution (Ti content: 28% by weight, specific gravity: 1.5, purity: 99.9%) was diluted with distilled water to prepare an aqueous titanium trichloride solution containing 0.25 mole/L as a concentration of Ti. The aqueous solution was cooled with ice so that the temperature was not elevated, and thus, the solution was maintained at a temperature not higher than 50° C. A

TABLE 1

| Extracted from JCPDS cards (Card No.) | | | | | | | | |
|---|---|---|---|---|---|---|---|---|
| Brookite (29-1360) | | | Anatase (21-1272) | | | Rutile (21-1276) | | |
| d value | Crystal face | Relative intensity | d value | Crystal face | Relative intensity | d value | Crystal face | Relative intensity |
| 3.51 | 120 | 100 | 3.52 | 101 | 100 | 3.25 | 110 | 100 |
| 2.90 | 121 | 90 | 1.89 | 200 | 35 | 1.69 | 211 | 60 |
| 3.47 | 111 | 80 | 2.38 | 004 | 20 | 2.49 | 101 | 50 | reaction vessel equipped with a reflux condenser was charged with 500 ml of the solution. While the content was heated to 85° C. ozone gas having a purity of 80% was blown into the content at a blowing rate of 1 liter/mmn by an ozone gas-generating apparatus to effect oxidation reaction. The content was maintained, as it was, for 2 hours to complete the reaction.

The thus-obtained sol was filtered and vacuum-dried to obtain a powder. Quantitative analysis of the powder by the X-ray diffraction analysis revealed that the ratio (the intensity of the peak attributed to the 121 face of brookite-type)/ (the peak intensity at the overlapped position) was 0.85, and the ratio (the intensity of the main peak attributed to rutile-type)/(the peak intensity at the overlapped position) was 0. By calculation from these ratios, the thus-obtained crystalline titanium oxide was proven to have a brooklte content of approximately 98t by weight, a rutile content of 0% by weight. An anatase content of 0% by weight, and an amorphous content of approximately 2% by weight. The obtained fine particles were observed by a transmission electron microscope, to determine the particle size. The particles had an average primary particle diameter of 0.05 $\mu$m.

Comparative Example 3 (Synthesis of anatase-type titanium oxide)

A solution (145 ml) of titanium sulfate (Ti: 30% by weight, specific gravity 1.65) was added to distilled water (855 ml). The titanium sulfate concentration was 1.5 mole/l. The resultant solution was heated to 100° C. to effect hydrolysis, to thereby produce white precipitate. The precipitate was separated by filtration, washed, and dried in a vacuum dryer at 60° C., to thereby produce a powder. X-ray diffraction analysts of the powder revealed that the titanium oxide was anatase-type. The average particle diameter of primary particles determined through observation by a transmission electron microscope was 0.025 $\mu$m.

Comparative Example 4 (Synthesis of rutile-type titanium oxide)

A solution of titanyl sulfate was thermally decomposed by a customary method, and the resultant mixture was separated by filtration and washed to thereby produce an aqueous titanium oxide slurry (950 g, 100 g as reduced to $TiO_2$). To the slurry, a 48% NaOH solution (80 g) was added with stirring, and the mixture was heated at 95° C. for four hours. Subsequently, the resultant matter was thoroughly washed, to thereby produce a slurry (2 kg). To the slurry, an aqueous hydrochloric acid having a concentration of 30% by weight (600 g) was added with stirring, and the mixture was heated at 98° C. for five hours, to prepare a titanta sol.

X-ray dirfraction analysis of the titania sol revealed that the titania was rutile-type. The average particle diameter of the thus-obtained rutile-types titanium oxide fine particles was 0.012 $\mu$m.

Fabrication of a dye-sensitization-type photoelectric conversion element

Using each of the titanium oxides produced in Examples 1, 2 and 3, and Comparative Examples 1 through 4 as a semiconductor, a dye-sensitization-type photoelectric conversion element having a structure illustrated in FIG. 1 was fabricated as follows.

A glass substrate was coated with fluorine-doped tin oxide to thereby form a conductive transparent electrode. Each type of titanium oxide particles was made into a paste, which was then applied onto the electrode to a thickness of 50 $\mu$m by bar-coating, and fired at 500° C. to thereby form a thin layer having a thickness of approximately 20 $\mu$m. Then, a $3 \times 10^{-4}$ M ethanol solution of a ruthenium complex, $RuL_2(SCN)_2$ (L=2,2'-bipyridyl-4,4'-dicarboxylate) was prepared, and the thus-obtained titanium oxide thin layer-formed glass substrate was immersed in the ruthenium complex solution for 12 hours at room temperature. Thus, the ruthenium complex was deposited on the titanium oxide thin layer.

Using an acetonitrile solution containing tetrapropylammonium iodide and lithium iodide served as an electrolyte, and a platinum counter electrode, a photoelectric conversion element having a structure illustrated in FIG. 1 was fabricated.

Photoelectric conversion was carried out by irradiation of the element with light from a 160-W high-pressure mercury lamp (light in the infrared range was cut by a filter), and short-circuit current and open-clrcuit voltage were measured. The results are shown in Table 2.

TABLE 2

| | Titanium oxide content of each crystal structure type (wt. %) | | | Short-circuit current | Open-circuit voltage |
|---|---|---|---|---|---|
| | brookite | anatase | rutile | (mA/cm$^2$) | (mV) |
| Example 1 | 50 | 10 | 40 | 3.0 | 300 |
| Comp.Ex. 1 | — | 100 | — | 2.0 | 200 |
| Comp.Ex. 2 | — | — | 100 | 0.5 | 50 |
| Example 2 | 70 | 28.8 | 1.2 | 4.0 | 400 |
| Example 3 | 98 | — | — | 4.5 | 450 |
| Comp.Ex. 3 | — | 100 | — | 2.5 | 250 |
| Comp.Ex. 4 | — | — | 100 | 1.0 | 200 |

As seen from Table 2, the dye-sensitization-type photoelectrlc conversion element of the present invention comprising brookite-type titanium oxide as semiconductor exhibits excellent photoelectric conversion, as compared with the conventional dye-sensitization-type photoelectric conversion element comprising anatase-type or rutile-type titanium oxide as semiconductor. The element comprising the brookite-type titanium oxide semiconductor is produced at low cost. Thus. a solar cell made of the element is advantageous as compared with a silicon solar cell.

What is claimed is:

1. A dye-sensitization photoelectric conversion element comprising a semiconductor and a dye adhering onto a surface of the semiconductor, which semiconductor comprises larger than about 50% by weight, based on the weight of the semiconductor, of brookite titanium oxide.

2. A dye-sensitization photoelectric conversion element according to claim 1, wherein the semiconductor comprises at least about 70% by weight, based on the weight of the semiconductor, of brookite titanium oxide.

3. A dye-sensitization photoelectric conversion element according to claim 1, wherein the semiconductor is made of a titanium oxide sol comprising larger that about 50% by weight brookite titanium oxide, produced by a process comprising a step of hydrolyzing titanium tetrachloride or titanium trichloride.

4. A dye-sensitization photoelectric conversion element according to claim 3, wherein the titanium oxide sol is a mixed crystal sol of anatase titanium oxide/brookite titanium oxide, which contains smaller than about 50% by weight of anatase titanium oxide.

5. A dye-sensitization photoelectric conversion element according to claim 3, wherein the titanium oxide sol is a mixed crystal sol of rutile titanium oxide/brookite titanium oxide, which contains smaller then about 50% by weight of rutile titanium oxide.

6. A dye-sensitization photoelectric conversion element according to claim 3, wherein the titanium oxide sol is a mixed crystal sol of anatase titanium oxide/rutile titanium oxide/brookite titanium oxide, which contains smaller than about 50% by weight of the sum of anatase titanium oxide and rutile titanium oxide.

7. A dye-sensitization photoelectric conversion element according to claim 1, wherein the titanium oxide is particles having an average particle diameter of not larger than about 0.05 μm.

8. A dye-sensitization photoelectric conversion element according to claim 1, wherein the dye is selected from the group consisting of ruthenium complexes and porphyrin derivatives.

9. A process for producing a dye-sensitization photoelectric conversion element of claim 1, which comprises a step of immersing a substrate having a titanium oxide surface layer predominantly comprised of brookite titanium oxide in a solution containing a dye to allow the dye to adhere onto the titanium oxide surface layer.

* * * * *